(12) United States Patent
Lauffer et al.

(10) Patent No.: US 7,377,033 B2
(45) Date of Patent: May 27, 2008

(54) METHOD OF MAKING CIRCUITIZED SUBSTRATE WITH SPLIT CONDUCTIVE LAYER AND INFORMATION HANDLING SYSTEM UTILIZING SAME

(75) Inventors: John M. Lauffer, Waverly, NY (US); James M. Larnerd, Binghamton, NY (US); Voya R. Markovich, Endwell, NY (US)

(73) Assignee: Endicott Interconnect Technologies, Inc., Endicott, NY (US)

( * ) Notice: Subject to any disclaimer, the term of this patent is extended or adjusted under 35 U.S.C. 154(b) by 0 days.

(21) Appl. No.: 11/641,810

(22) Filed: Dec. 20, 2006

(65) Prior Publication Data

US 2007/0144772 A1 Jun. 28, 2007

Related U.S. Application Data

(62) Division of application No. 10/882,167, filed on Jul. 2, 2004, now Pat. No. 7,157,646.

(51) Int. Cl.
*H01K 3/10* (2006.01)

(52) U.S. Cl. .............. 29/852; 29/830; 29/850; 29/858

(58) Field of Classification Search ............. 29/830, 29/850, 852, 858
See application file for complete search history.

(56) References Cited

U.S. PATENT DOCUMENTS

| | | | |
|---|---|---|---|
| 5,384,433 A | 1/1995 | Osann, Jr. et al. | |
| 5,418,689 A | 5/1995 | Alpaugh et al. | |
| 5,488,540 A | 1/1996 | Hatta | |
| 5,685,070 A | 11/1997 | Alpaugh et al. | |
| 5,736,796 A | 4/1998 | Price et al. | |
| 5,912,809 A | 6/1999 | Steigerwald et al. | |
| 6,204,453 B1 | 3/2001 | Fallon et al. | |
| 6,288,906 B1 | 9/2001 | Sprietsma et al. | |
| 6,329,603 B1 * | 12/2001 | Japp et al. | 174/255 |
| 6,373,717 B1 * | 4/2002 | Downes et al. | 361/795 |
| 6,418,031 B1 | 7/2002 | Archambeault | |
| 6,557,154 B1 | 4/2003 | Harada et al. | |
| 6,722,031 B2 * | 4/2004 | Japp et al. | 29/852 |
| 6,826,830 B2 * | 12/2004 | Egitto et al. | 29/852 |
| 7,087,846 B2 * | 8/2006 | Alcoe | 174/267 |

\* cited by examiner

*Primary Examiner*—C. J Arbes
(74) *Attorney, Agent, or Firm*—Hinman, Howard & Kattell LLP; Lawrence R. Fraley; Mark Levy

(57) ABSTRACT

A method of making circuitized substrate which includes a plurality of contiguous open segments which define facing edge portions within an electrically conductive layer to isolate separate portions of the conductive layer such that the layer can be used for different functions, e.g., as both power and ground elements, within a product (e.g., electrical assembly) which includes the substrate as part thereof. An information handling system, e.g., a mainframe computer, which represents one of the products in which the substrate may be utilized, is also provided.

13 Claims, 4 Drawing Sheets

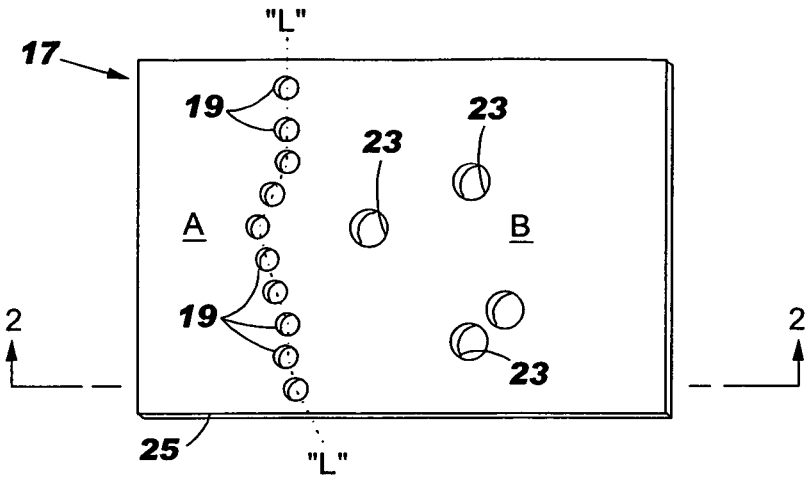
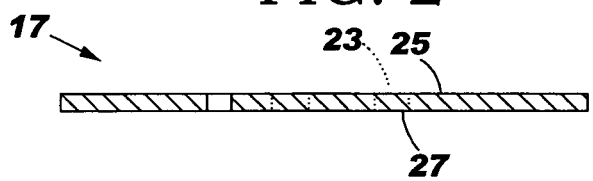
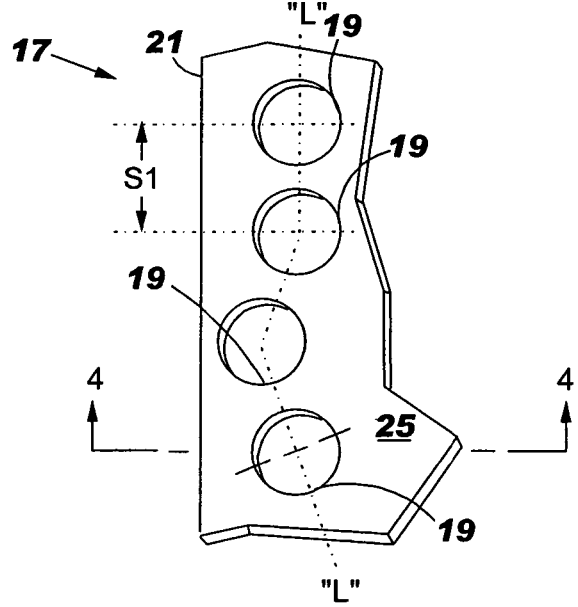
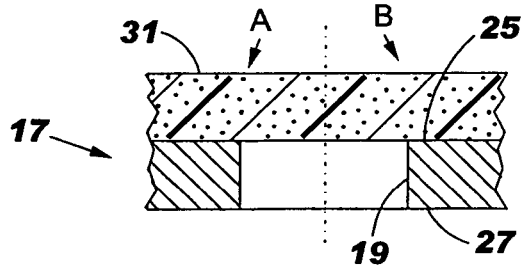
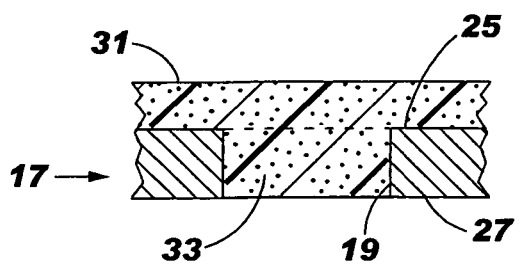

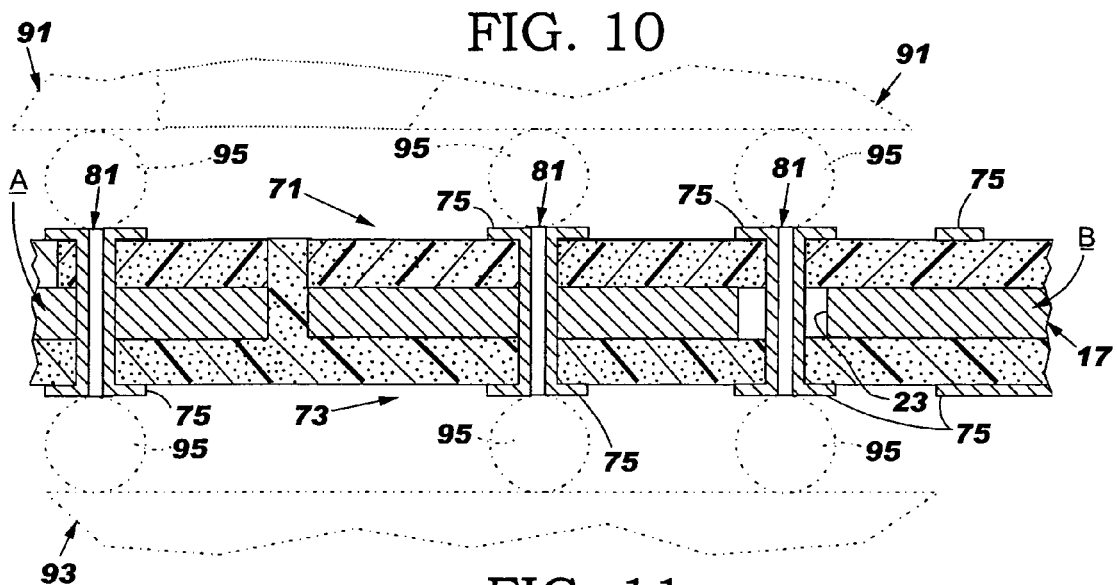
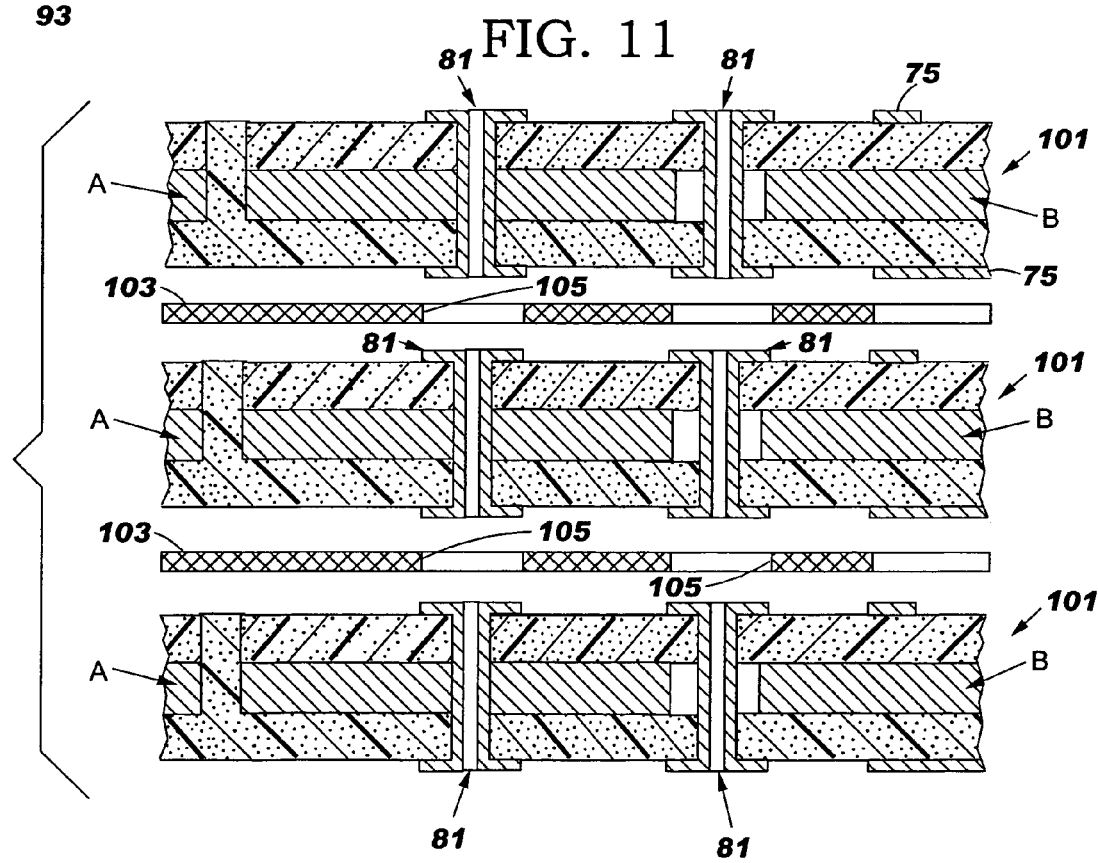

METHOD OF MAKING CIRCUITIZED SUBSTRATE WITH SPLIT CONDUCTIVE LAYER AND INFORMATION HANDLING SYSTEM UTILIZING SAME

CROSS-REFERENCE TO CO-PENDING APPLICATIONS

In Serial Number (Ser. No.) 10/882,170, filed Jul. 2, 2004 and entitled "CIRCUITIZED SUBSTRATE WITH FILLED ISOLATION BORDER, METHOD OF MAKING SAME, ELECTRICAL ASSEMBLY UTILIZING SAME, AND INFORMATION HANDLING SYSTEM UTILIZING SAME" (Inventors: J. Lauffer et al), there is defined a circuitized substrate which includes a plurality of contiguous open segments along a side edge portion of at least one electrically conductive layer thereof, these open segments isolated by a barrier of dielectric material which substantially fills the open segments, e.g., during a lamination process which bonds two dielectric layers of the substrate to the conductive layer. A method of making the substrate, an electrical assembly utilizing the substrate, a multilayered circuitized assembly also utilizing the substrate and an information handling system, e.g., a personal computer, are also provided. Ser. No. 10/882,170 is now U.S. Pat. No. 7,157,647.

TECHNICAL FIELD

This invention relates to circuitized substrates and particularly to those used in multilayered circuit boards, chip carriers, and the like, and to processes for manufacturing same. More particularly, the invention relates to such substrates and resulting assemblies which can be used as part of what are referred to in the art as "information handling systems."

In Ser. No. 10/882,167, also filed Jul. 2, 2004, and entitled "CIRCUITIZED SUBSTRATE WITH SPLIT CONDUCTIVE LAYER, METHOD OF MAKING SAME, ELECTRICAL ASSEMBLY UTILIZING SAME, AND INFORMATION HANDLING SYSTEM UTILIZING SAME" (Inventors: J. Lauffer et al), there is defined a circuitized substrate which includes a plurality of contiguous open segments which define facing edge portions within an electrically conductive layer to isolate separate portions of the conductive layer such that the layer can be used for different functions, e.g., as both power and ground elements, within a product (e.g., electrical assembly) which includes the substrate as part thereof. A method of making the substrate, an electrical assembly utilizing the substrate, a multilayered circuitized assembly also utilizing the substrate and an information handling system, e.g., a mainframe computer, are also provided.

The present application is a divisional application of Ser. No. 10/882,167. filed Jul. 2, 2004, Ser. No. 10/882,167 is now U.S. Pat. No. 7,157,646.

BACKGROUND OF THE INVENTION

Various electronic structures such as multilayered printed circuit boards (PCBs), laminate chip carriers, and the like permit formation of multiple circuits in a minimum volume or space. These structures typically comprise a stack of layers of signal, ground and/or power planes separated from each other by a layer of dielectric material. The lines are often in electrical contact with each other by plated holes passing through the dielectric layers. The plated holes are often referred to as "vias" if internally located, "blind vias" if extending a predetermined depth within the board from an external surface, or "plated thru-holes" (PTHs) if extending substantially through the board's full thickness. By the term "thru-hole" as used herein is meant to include all three types of such board openings.

Currently known methods of fabricating PCBs, chip carriers and the like typically comprise fabrication of separate inner-layer circuits (circuitized layers), which are formed by coating a photosensitive layer or film over a copper layer of a copper clad inner-layer base material. The photosensitive coating is imaged, developed and the exposed copper is etched to form conductor lines. After etching, the photosensitive film is stripped from the copper leaving the circuit pattern on the surface of the inner-layer base material. This processing is also referred to as photolithographic processing in the PCB art and further description is not deemed necessary.

After formation of individual inner-layer circuits, a multilayer stack is formed by preparing a lay-up of inner-layers, ground planes, power planes, etc., typically separated from each other by a layer of dielectric pre-preg material, the latter typically comprising a layer of glass (typically fiberglass) cloth impregnated with a partially cured material, typically a B-stage epoxy resin. The top and bottom outer layers of the stack usually comprise copper clad, glass-filled, epoxy planar substrates with the copper cladding comprising exterior surfaces of the stack. The stack is laminated to form a monolithic structure using heat and pressure to fully cure the B-stage resin. The stack so formed typically has metal (usually copper) cladding on both of its exterior surfaces. Exterior circuit layers are formed in the copper cladding using procedures similar to the procedures used to form the inner-layer circuits. A photosensitive film is applied to the copper cladding. The coating is exposed to patterned activating radiation and developed. An etchant is then used to remove copper bared by the development of the photosensitive film. Finally, the remaining photosensitive film is removed to provide the exterior circuit layers.

Electrically conductive thru-holes (or interconnects), as mentioned above, are used to electrically connect individual circuit layers within the structure to each other and to the outer surfaces, and typically pass through all or a portion of the stack. Thru-holes are generally formed prior to the formation of circuits on the exterior surfaces by drilling holes through the stack at appropriate locations. Following several pre-treatment steps, the walls of the holes are catalyzed by contact with a plating catalyst and metallized, typically by contact with an electroless or electrolytic copper plating solution to form conductive pathways between circuit layers. Following formation of the conductive thru-holes, exterior circuits, or outer layers are formed using the procedure described above.

After substrate construction, chips and/or other electrical components are mounted at appropriate locations on the exterior circuit layers of the multilayered stack, typically using solder mount pads to bond the components to the PCB. The components are often in electrical contact with the circuits within the structure through the conductive thru-holes, as desired. The solder pads are typically formed by coating an organic solder mask coating over the exterior circuit layers. The solder mask may be applied by screen coating a liquid solder mask coating material over the surface of the exterior circuit layers using a screen having openings defining areas where solder mount pads are to be formed. Alternatively, a photoimageable solder mask may be coated onto the board and exposed and developed to yield an array of openings defining the pads. The openings are then coated with solder using processes known to the art such as wave soldering.

Complex product designs have become the norm in today's manufacturing world of substrates as the demand for operational capabilities for such products have increased significantly over the past few years. For example, PCBs for mainframe computers may have as many as 36 layers of circuitry or more, with the complete stack having a thickness of as much as about 0.250 inch (250 mils). These boards are typically designed with three or five mil wide signal lines and twelve mil diameter thru-holes. For increased circuit densification in many of today's electronic products such as PCBs, chip carriers and the like, the industry seeks to reduce signal lines to a width of two mils or less and hole diameters to two mils or less.

As will be defined in greater detail hereinbelow, the present invention provides a circuitized substrate which includes a "split" conductive (e.g., power) plane as one element thereof. By the term "split" as used herein is meant a conductive layer with at least two separate (electrically isolated) portions, such that each portion is capable of carrying different current levels, provide separate functions such as power and ground all on one plane, etc. This feature thus significantly expands the capability of the final structure because it allows for many additional design considerations in the final product. As understood, such a final product may include a multitude of such split conductive planes to provide even greater capabilities over known products.

In U.S. Pat. No. 6,288,906, issued Sep. 11, 2001, there is described a method of making a multi-layer printed circuit board that includes power planes for its outer conductive layers. The outer conductive layers are patterned to accept circuitry, such as integrated circuits and surface mount devices. Mounting pads are provided on the outer conductive layers which include plated-through vias (holes) for electrical interconnection with other conductive layers of the board.

In U.S. Pat. No. 5,912,809, issued Jun. 15, 1999, the electrical potentials and very high frequency (VHF) currents in a circuit board are controlled by patterning the power plane of a multiple layered, capacitive plane printed circuit board in selected geometric patterns. The selected geometric patterns, both simple and complex, control voltages and currents by channeling the capacitance capacity for usage directed to a particular integrated circuit or circuits, isolated to a particular integrated circuit or circuits, or shared between integrated circuits.

In U.S. Pat. No. 5,685,070, issued Nov. 11, 1997, there is described a method of making a printed circuit board or card for direct chip attachment that includes at least one power core, at least one signal plane that is adjacent to the power core, and plated thru-holes for electrical connection is provided. In addition, a layer of dielectric material is adjacent the power core and a circuitized conductive layer is adjacent the dielectric material, followed by a layer of photosensitive dielectric material adjacent the conductive layer. Photodeveloped blind vias for subsequent connection to the power core and drilled blind vias for subsequent connection to the signal plane are provided.

In U.S. Pat. No. 5,418,689, issued May 23, 1995, there is described a method of making a printed circuit board for direct chip attachment that includes at least one power core, at least one signal plane adjacent the power core, and plated thru-holes for electrical connection. In addition, a layer of dielectric material is adjacent the power core and a circuitized conductive layer is adjacent the dielectric material, followed by a layer of photosensitive dielectric material adjacent the conductive layer.

In U.S. Pat. No. 5,384,433, issued Jan. 24, 1995, there is described a method of making a printed circuit board that includes an array of conductive pads including component-mounting holes disposed on first and second surfaces thereon. An array of conductive attachment lands arranged in pairs of first and second attachment lands are disposed on the first and second surfaces. The first and second attachment lands are insulated from one another and separated by a distance selected to allow attachment of standard sized components therebetween on the first and second surfaces of said circuit board. First and second conductive power distribution planes are disposed on the first and second surfaces and are insulated from the conductive pads and the second attachment lands disposed thereon.

Other methods of making circuitized substrates (namely PCBs) are described in the following U.S. Patents:

| | |
|---|---|
| 5,488,540 | Hatta |
| 5,736,796 | Price et al |
| 6,204,453 | Fallon et al |
| 6,418,031 | Archambeault et al |
| 6,557,154 | Harada et al |

As described herein, the present invention represents a significant improvement over known processes, including those described above, used in the production of circuitized substrates such as PCBs. As mentioned above, one particularly significant feature of this invention is the provision of a conductive layer such as a power plane with at least two separate, isolated portions. Such isolation is assured by the utilization of a protective barrier of dielectric material between the facing edge portions of the separated portions, which portions have been formed using a series of openings formed in the initial conductive layer.

It is believed that such an invention will represent a significant advancement in the art.

OBJECTS AND SUMMARY OF THE INVENTION

It is a primary object of this invention to enhance the circuitized substrate art.

It is another object of the invention to provide a method of making a circuitized substrate which may be performed using conventional processes known in the art and which is thus relatively easy and inexpensive to implement.

It is another object of this invention to provide various structures which are adaptable for utilizing a substrate so formed by the method taught herein and which thus possess the significant advantages taught herein.

According to one embodiment of the invention, there is provided a circuitized substrate comprising at least one electrically conductive layer of substantially planar configuration and having first and second opposing surfaces, the at least one electrically conductive layer including at least two separate, electrically isolated portions, each electrically isolated portion including an edge portion substantially facing an edge portion of at least one other electrically isolated portion, the edge portions facing each other comprised of a plurality of contiguous formed open segments, a first dielectric layer positioned on the first opposing surface of the at least one electrically conductive layer, a portion of this first dielectric layer substantially filling selected ones of the contiguous formed open segments of the facing edge portions, and a second dielectric layer positioned on the second opposing surface of the electrically conductive layer, a portion of this second dielectric layer substantially filling the remaining ones of contiguous formed open segments of the facing edge portions, the portions of first and second dielectric layers providing a common, substantially solid dielectric barrier between these facing edge portions.

According to another embodiment of the invention, there is provided a method of making a circuitized substrate, the method comprising providing at least one electrically conductive layer of substantially planar configuration having first and second opposing surfaces and including at least two separate, electrically isolated portions, each electrically isolated portion including an edge portion substantially facing an edge portion of at least one other electrically isolated portion, the edge portions facing each other comprised of a plurality of contiguous formed open segments, positioning a first dielectric layer on the first opposing surface of the electrically conductive layer, substantially filling selected ones of the contiguous formed open segments of the facing edge portions with a portion of the first dielectric layer, positioning a second dielectric layer on the second opposing surface of the at least one electrically conductive layer, and substantially filling the remaining ones of the contiguous formed open segments of the facing edge portions with a portion of the second dielectric layer, the portions of first and second dielectric layers providing a common, substantially solid dielectric barrier between the facing edge portions.

According to yet another embodiment of the invention, there is provided an electrical assembly comprising a circuitized substrate including at least one electrically conductive layer of substantially planar configuration and having first and second opposing surfaces, the at least one electrically conductive layer including at least two separate, electrically isolated portions, each electrically isolated portion including an edge portion substantially facing an edge portion of at least one other electrically isolated portion, the edge portions facing each other comprised of a plurality of contiguous formed open segments, a first dielectric layer positioned on the first opposing surface of the electrically conductive layer, a portion of this first dielectric layer substantially filling selected ones of the contiguous formed open segments of the facing edge portions, and a second dielectric layer positioned on the second opposing surface of the at least one electrically conductive layer, a portion of the second dielectric layer substantially filling the remaining ones of the contiguous formed open segments of the facing edge portions, the portions of first and second dielectric layers providing a common, substantially solid dielectric barrier between said facing edge portions. The electrical assembly further includes at least one electrical component positioned on and electrically coupled to the circuitized substrate.

According to still another embodiment of the invention, there is provided a multilayered circuitized structure comprising a first circuitized substrate portion including at least one electrically conductive layer of substantially planar configuration and having first and second opposing surfaces, the at least one electrically conductive layer including at least two separate, electrically isolated portions, each electrically isolated portion including an edge portion substantially facing an edge portion of at least one other electrically isolated portion, the edge portions facing each other comprised of a plurality of contiguous formed open segments, a first dielectric layer positioned on the first opposing surface of the at least one electrically conductive layer, a portion of the first dielectric layer substantially filling selected ones of the contiguous formed open segments of the facing edge portions, and a second dielectric layer positioned on the second opposing surface of the at least one electrically conductive layer, a portion of the second dielectric layer substantially filling the remaining ones of the contiguous formed open segments of the facing edge portions, the portions of first and second dielectric layers providing a common, substantially solid dielectric barrier between the facing edge portions, the first circuitized substrate having a first pattern of interconnecting conductive thru-holes therein of a first density, and second and third circuitized substrate portions positioned on opposite sides of the first circuitized substrate portion, each having a second pattern of interconnecting thru-holes therein, the second patterns of interconnecting thru-holes being electrically coupled to the interconnecting conductive thru-holes of the first circuitized substrate portion such that the first circuitized substrate portion provides electrical interconnection between the second and third circuitized substrate portions.

According to another embodiment of the invention, there is provided an information handling system comprising a housing, an electrical assembly positioned substantially within the housing and including a circuitized substrate having at least one electrically conductive layer of substantially planar configuration and having first and second opposing surfaces, the at least one electrically conductive layer including at least two separate, electrically isolated portions, each electrically isolated portion including an edge portion substantially facing an edge portion of at least one other electrically isolated portion, the edge portions facing each other comprised of a plurality of contiguous formed open segments, a first dielectric layer positioned on the first opposing surface of the at least one electrically conductive layer, a portion of the first dielectric layer substantially filling selected ones of the contiguous formed open segments of the facing edge portions, and a second dielectric layer positioned on the second opposing surface of the at least one electrically conductive layer, a portion of the second dielectric layer substantially filling the remaining ones of contiguous formed open segments, the portions of first and second dielectric layers providing a common, substantially solid dielectric barrier between the facing edge portions. The system further includes at least one electrical component positioned on and electrically coupled to the circuitized substrate of the electrical assembly.

BRIEF DESCRIPTION OF THE DRAWINGS

FIGS. 1-9 illustrate the various steps of producing a circuitized substrate in accordance with one embodiment of the invention;

FIG. 10 is a side-elevational view showing a circuitized substrate of the invention interconnecting a pair of opposed electronic components;

FIG. 11 illustrates a plurality of circuitized substrates for being bonded together to form a multilayered circuitized structure in accordance with one embodiment of the invention;

BEST MODE FOR CARRYING OUT THE INVENTION

Figure 6:
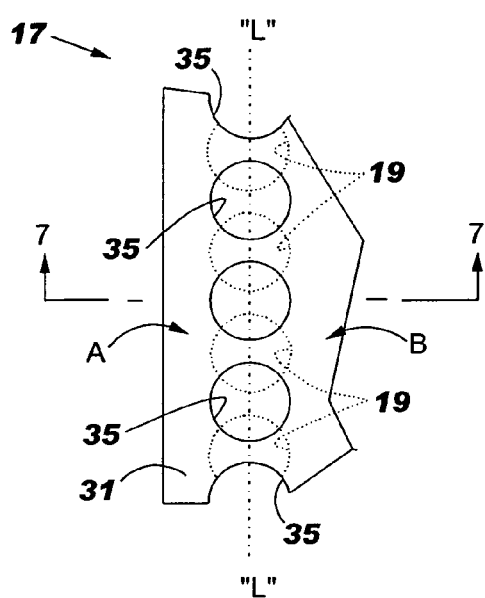

For a better understanding of the present invention, together with other and further objects, advantages and capabilities thereof, reference is made to the following disclosure and appended claims in connection with the above-described drawings.

"Information handling system" as used herein shall mean any instrumentality or aggregate of instrumentalities primarily designed to compute, classify, process, transmit, receive, retrieve, originate, switch, store, display, manifest, measure, detect, record, reproduce, handle or utilize any form of information, intelligence or data for business, scientific, control or other purposes. Examples include personal computers and larger processors such as computer servers and mainframes. Such products are well known in the art and are also known to include PCBs and other forms of circuitized substrates as part thereof, some including several such components depending on the operational requirements thereof.

In FIG. 1, there is shown a first step in producing a circuitized substrate according to one embodiment of the invention. In this step, a single sheet 17 of electrically conductive material (preferably copper) of substantially planar and rectangular shape (as shown) is initially provided with a plurality of openings 19 which form a particular pattern within the sheet. This pattern is shown only as a singular line of openings but it is understood it could be a plurality of lines. The purpose of the curvilinear pattern of these initial openings 19 (and the subsequent openings and processing defined herein) is to define at least two separate and electrically isolated portions (represented as "A" and "B" in FIG. 1) for the single sheet 17. Although only two are shown, the use of added opening patterns may of course define further isolated portions of different shapes. The two shown in FIG. 1 (and in other FIGS. below) are only being shown for ease of explanation, as others are possible. "A" and "B" are thus "divided" initially in FIG. 1 by the curvilinear line "L"-"L". In one example, a total of 350 initial openings 19 may be provided along the illustrated pattern within a copper sheet having dimensions of seventeen inches (width) by seventeen inches (length). Further description of these openings 19 is provided below. In addition, it is possible to also provide what are referred to in the PCB art as "clearance" openings 23 within the interior portion of the sheet as shown. The purpose of these clearance openings will be understood from the following description. Such clearance openings are not necessary in accordance with the broader aspects of this invention, however.

Sheet 17 is used as an electrically conductive layer within a circuitized substrate formed in accordance with the teachings herein. As understood, the separate portions of this conductive layer may perform different functions to thereby increase the operational capabilities of the final substrate as well as electrical assemblies and other products in which the substrate is utilized. Perhaps the most desirable usage would be as both a power and ground plane in which portion "A" could provide power to selected parts of the substrate (and any electrical components coupled thereto) and portion "B" could provide the ground for the substrate (and selected components). This is not meant to limit the invention, however, because the "split" sheet as defined herein may also be used as both a signal (typically where there would be additional single conductor lines and/or pads and/or thru-holes and the like as part thereof, none being shown for ease of explanation purposes) and ground plane, or even as a signal and power plane, if for example lesser current was needed for providing signals to selected components while greater power was needed for other components. All of these possibilities, and more if desired, depend on the operational requirements of the final product utilizing this invention.

Sheet 17 is shown in FIG. 2 in side view, as taken along the line 2-2 in FIG. 1. With a sheet having the dimensions above, the sheet is preferably of a thickness within the range of from about 0.0005 inch to about 0.004 inch. As stated, the preferred material for sheet 17 is copper, but other conductive metals are possible.

In FIG. 3, there is shown a partial, much enlarged view of sheet 17 showing only four of the initial openings 19. These could be any of the four in FIG. 1 and are not meant to represent any specific set therefrom. Accordingly, the orientation shown is primarily for ease of explanation purposes. The four openings 19 are illustrated as formed in the described, representative curvilinear pattern along the aforementioned line of demarcation "L"-"L". It is understood that these openings, each preferably of a diameter of from about 0.020 inch to about 0.100 inch, run along the entire length of line "L"-"L", as stated. Preferably, openings of the aforementioned diameter are spaced apart (S1) a distance of from about 0.030 inch to about 0.200 inch. Significantly, it is preferred that these initial openings not be contiguous but instead are preferably spaced as shown, for purposes to be described hereinbelow. It is possible, however, for some of these to be contiguous, e.g., three or four in one "set", separated by one or more spaced openings as shown in the drawings. The preferred manner for providing openings 19 is to use mechanical drills as is known in the PCB art. If sheet 17 is thin enough, and a powerful enough laser is utilized, it is also within the scope of the invention to provide openings 19 using such a laser. Chemical etching, another known process in the PCB art, is also possible to provide holes 19. This is also true for the clearance openings 23. Sheet 17, being substantially planar, includes first and second opposing, substantially planar surfaces 25 (facing the viewer in FIG. 3) and 27 (shown as the lower or bottom surface in FIG. 2).

In FIG. 4, a much enlarged view over FIGS. 1 and 2 (and slightly over FIG. 3), there is shown the positioning of a first dielectric layer 31 atop sheet 17 to substantially cover each of the initially provided openings 19. In FIG. 4, only one opening 19 is shown for illustration purposes. First dielectric layer 31 is preferably comprised of a fiberglass-reinforced polymer resin of a type known in the art as "FR4" dielectric material. This material includes a polymer resin with the fiberglass serving as reinforcement means.

Alternative materials for dielectric layer 31 are possible, examples including other known dielectric materials used in the manufacture of PCBs. One example of such a material is described in pending application Ser. No. 10/8 12,889, filed Mar. 31, 2004 and entitled, "Dielectric Composition For Forming Dielectric Layer For Use In Circuitized Substrates" (inventors: R. Japp et al). Ser.No. 10/8 12,889 is now U.S. Pat. No. 7,270,845. Another material which can be used for layer 31 is a polymer known as Driclad, a dielectric material produced and sold by the assignee of the present invention. (Driclad is a registered trademark of Endicott Interconnect Technologies, Inc.) FIG. 4, as shown, is taken along the line 4-4 in FIG. 3. The preferred means of positioning layer 31 is to use a lamination process which, as shown in FIG. 5, results in a portion 33 of layer 31 becoming embedded within (and substantially filling) each of the openings 19. This is a significant aspect of the invention for reasons stated hereinbelow. In one example, utilizing the aforementioned "FR4" material, the layer 31 possessed an initial thickness of about 0.004 inch and, following lamination, a reduced thickness (in FIG. 5) of about 0.0035 inch. As clearly seen in FIG. 5, only the illustrated portion 33 of dielectric layer 31 is positioned within the openings 19.

In FIG. 6, sheet 17 is again shown only partially and with four initial openings 19 (shown hidden). These openings are shown in FIG. 6 in a linear pattern for ease of explanation. Openings 19 are hidden from the viewer in FIG. 6 due to the covering dielectric layer 31. In FIG. 6, a second plurality of openings 35 are formed (three full in FIG. 6, with another one being partially shown), preferably of the same diameter as initial openings 19 and spaced a similar distance apart in the "offsetting" orientation relative to earlier provided openings 19 lying underneath. The preferred process for forming openings 35 is the same as that for openings 19. Significantly, this offsetting and spacing orientation results in each opening 35 being substantially centered over the interim strip of underlying copper of sheet 17 between a respective pair of the initially formed openings 19. This second series of openings thus serves to completely sever sheet 17 along the demarcation line "L"-"L" to divide it into the two electrically isolated portions A and B.

Figure 7:
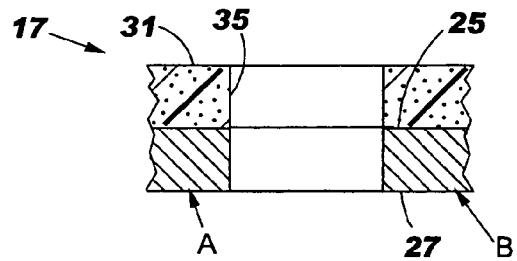

As shown in FIG. 7, taken along the line 7-7 in FIG. 6, each opening 35 extends entirely through the laminated dielectric layer 31 and the underlying copper sheet 17. As stated, and as clearly now seen in FIG. 7, sheet 17 has now been "split" into the two portions A and B as a result of the defined dual drilling operation such that no copper material physically interconnects these portions. As stated, this severing has resulted in just the two portions shown but it is also within the scope of the invention to provide various patterns of demarcation lines of openings to in turn define additional isolated portions within sheet 17, if desired.

Figure 8:
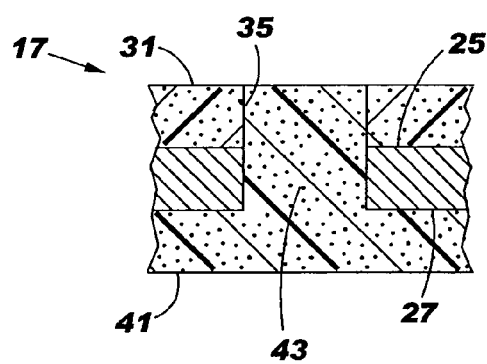

In FIG. 8, a second dielectric layer 41 is positioned on the second opposing surface 27 of the copper sheet 17 and laminated (preferably using a lamination process similar to that for layer 31 and described in greater detail below) such that a portion 43 of the second dielectric layer 41 will become embedded within and substantially fill each of the second openings 35. As seen in FIG. 8, this portion 43 also extends upwardly within the upper first layer 31 as a result of the lamination process. In one example of the invention, the preferred lamination process for laminating both layers 31 and 41 may be accomplished at a temperature within the range of from about 180 to about 250 degrees Celsius (C.), at a pressure of about 100 to about 1200 pounds per square inch (p.s.i.), and for a time period of about 30 to about 120 minutes. These parameters are not meant to limit the invention, of course, as other times, temperatures and pressures may be utilized depending on the materials and the various properties thereof (e.g., thickness) chosen. In one example, the structure shown in FIG. 8 may possess a final thickness (after the second lamination step) of from about 0.004 inch to about 0.020 inch.

Figure 9:
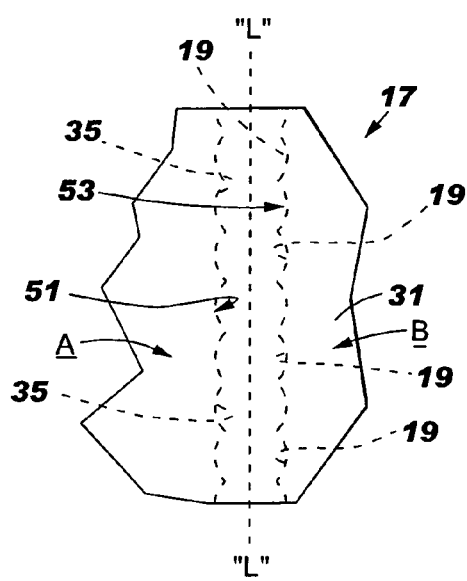

FIG. 9 is a top, plan view of sheet 17 with both series of openings 19 and 35 filled with interim dielectric material so as to form a substantially solid dielectric barrier between the aligned and formed openings. As seen, the resulting structure in FIG. 9 includes two facing edge portions 51 and 53 for isolated portions A and B, respectively. These newly formed interior (within the sheet) edges, substantially covered now with a protective layer of dielectric material along the entire lengths thereof, may be defined as the result of the illustrated plurality of contiguous, formed open segments. It is understood of course that these open segments are the partial exterior surfaces of the openings 19 and 35 formed using the processes defined above. The resulting structure, as seen in FIG. 9, includes the dielectric materials from the two dielectric layers laminated as defined herein. This edge portions 51 and 53 are formed as defined herein so as to be as smooth as possible utilizing such drilling or other formation processes. The edge portions are preferably smoother than as shown, the drawing being for illustration purposes only. Regardless of smoothness, however, these edge portions 51 and 53 are each covered by a solid dielectric covering over all of the contiguous open segments and are of a sheet of material having a thickness, coupled with the thicknesses of the two laminated dielectric layers, to assure a planar structure with sufficient rigidity such that it can now be successfully used with subsequent processing steps (including lamination) to form a larger, multilayered structure as mentioned in greater detail below. Further, the structure of FIGS. 8 and 9 is thin enough so as not to add significantly to the overall thickness of the final structure in which it is utilized. Therefore, more than one such FIGS. 8 and 9 structures may be utilized in each desired final structure.

As clearly seen in FIG. 8, only the illustrated portion 43 of the second dielectric layer 41 is positioned within opening 35. Comparing FIGS. 5 and 8, therefore, clearly shows that only portions of the first dielectric layer fill (are positioned within) the first set of openings 19 formed within the conductive layer 17 while only portions of the second dielectric layer fill (are positioned within) the second openings 35 formed within layer 17.

The invention has been defined with respect to providing layers 31 and 41 separately and individually laminating each in a separate lamination step. The invention is not so limited, however, because it is possible, after forming the first pattern of openings 19 in sheet 17 as shown in FIG. 3, to laminate both layers 31 and 41 onto the conductive layer in a single lamination step, using the parameters cited above. Following this single lamination step, it is possible to then form the second pattern of openings 35, these extending through the entire thickness of the laminated 3-layered structure. A second lamination procedure may then be utilized to embed a third dielectric layer (preferably of similar composition as layer 31 and/or layer 41) within the formed openings 35.

In its simplest form, the structure of FIG. 9 may be used as a circuitized substrate in that the conductive layer 17 may be electrically coupled (e.g., using a thru-hole as defined hereinabove) to electronic components such as resistors, capacitors and even larger components such as chip carriers. In a preferred embodiment of the invention, however, the structure of FIG. 9 is preferably provided with a pair of opposing conductive layers 71 and 73 as shown in FIG. 10. Each conductive layer 71 and 73 may be a signal layer (as shown) or, as stated, it is also within the scope of the invention for the internal layer 17 to be a partial signal layer with the other portion performing another function such as power or ground. The specific orientation of conductive layers is defined by the desired function thereof in the final product and may be in any orientation which satisfies the operational requirements of said product. The embodiment of FIG. 10 is thus meant to be for representative purposes only and is not meant to limit the invention. Should layers 71 and 73 be signal layers, each may comprise a plurality of conductive pads, lands, or lines (all being represented by the numeral 75), or combinations thereof. Preferably, these conductive planes 71 and 73 are interconnected using a plurality of conductive thru-holes 81 formed in accordance with known PCB manufacturing techniques. Such thru-holes are preferably of copper and extend through the entire thickness of the FIG. 9 structure to interconnect the opposite layers 71 and 73 as shown. If planes 71 and 73 are signal planes, and plane 17 a power or ground plane, the signal planes preferably will not be electrically connected to plane 17 and hence the reason for the clearance holes 23 described in FIGS. 1 and 2. The thru-hole to the right in FIG. 10 extends through and does not electrically engage plane 17 because of the larger diameter clearance hole 23, whereas the two thru-holes 81 to the left both couple to plane 17 and thus to both isolated portions A and B of the plane. It is possible for many more of the conductive thru-holes 81 to be used, including more electrically coupled to the two separate portions of plane 17, again depending on the operational requirements for the final circuitized substrate. FIG. 10 thus represents only one example of a circuitized substrate which may be produced using the teachings herein.

For a more complex final product, the resulting circuitized substrate may also include more than three conductive planes as part thereof. It is possible, using the teachings of the invention, to produce a singular circuitized substrate having a plurality of signal, power and ground planes as part thereof. In such an embodiment, the structure such as formed as shown in FIG. 10 would include additional dielectric layers over the respective conductive planes 71 and/or 73 and additional conductive planes formed thereon, this procedure continuing until the desired number of conductive and dielectric layers are obtained. Selected conductors of these added conductive planes could be in turn electrically coupled to portions A and B, as needed. One example might be where selected portions of said added layers, and any components coupled thereto, are coupled to one portion of the sheet 17 for grounding purposes. Still further embodiments are within the knowledge of those skilled in the art, and added explanation is not considered necessary here.

In the particular embodiment of FIG. 10, the outer conductive pads 75 of the thru-holes 81 may be utilized to interconnect a pair of electronic components 91 and 93 (i.e., utilizing solder balls 95) as shown. In this arrangement, one example of an electronic component 91 may be a chip carrier in which a semiconductor chip is positioned on and electrically coupled to a circuitized substrate and covered, e.g., with a protective covering of "glob top" (a conventional electrically insulative encapsulant material)), such chip carriers produced and sold by the assignee of the present invention. One known such product is referred to as a Hyper-BGA chip carrier. (Hyper-BGA is a registered trademark of Endicott Interconnect Technologies, Inc.) One example of a second electronic component 93 may be a PCB, several types of which are also produced and sold by the assignee of the present invention. In its simplest form, the circuitized substrate in FIG. 10, having but one electrical component positioned thereon, may be defined as an electrical assembly. By way of example, the circuitized substrate in FIG. 10 may itself be a PCB with the component 91 a chip carrier, while not including the underlying substrate 93. This form of electrical assembly (carrier and PCB) are also produced and sold by the assignee of this invention. In such an assembly, a lower conductive plane 73 may not be needed with the thru-holes instead being connected only to respective internal conductive planes as mentioned above.

In FIG. 11, three circuitized substrates of the type shown in FIG. 10 are shown as being aligned for bonding together to form a multilayered circuitized substrate in accordance with one embodiment of the invention. Each substrate, referred to by the numeral 101 and similar to substrate 17 in FIG. 10, is aligned relative to the other two such that the patterns of thru-holes 81 in all three are aligned. A sheet of known dielectric pre-preg material 103 may be utilized between each pair of substrates 101, and includes openings 105 therein so as to enable the land portions 75 of mating thru-holes to become physically engaged to one another. (Each substrate 101 is understood to include the thru-holes 81 shown to the far left in FIG. 10, and thus the remaining other isolated portion A, but these thru-holes are not shown in FIG. 11 for ease of illustration.) In another embodiment, it is also possible to utilize conductive paste or the like (not shown) to form the connection between the respective lands of the substrates. Conductive paste is known in the PCB art and further description is not deemed necessary. The structure, shown in exploded view in FIG. 11, is now laminated to form a single, compact structure with each of the thru-holes being electrically coupled to form a continuous thru-hole extending through the entire surface of this final, multilayered structure. It is within the scope of the invention that selected ones of the various thru-holes not extend entirely through the final structure but instead only be coupled to corresponding selected ones of the thru-holes located within the interim circuitized substrate, again depending upon the operational requirements for the finished multilayered structure. The final laminated multilayered circuitized structure may be used as a PCB, a smaller chip carrier, or other circuitized substrate. In a still further embodiment of the invention, the various substrates 101 of FIG. 11 are electrically interconnected to each other after a final lamination step by conventional drilled and plated through holes.

Figure 12:
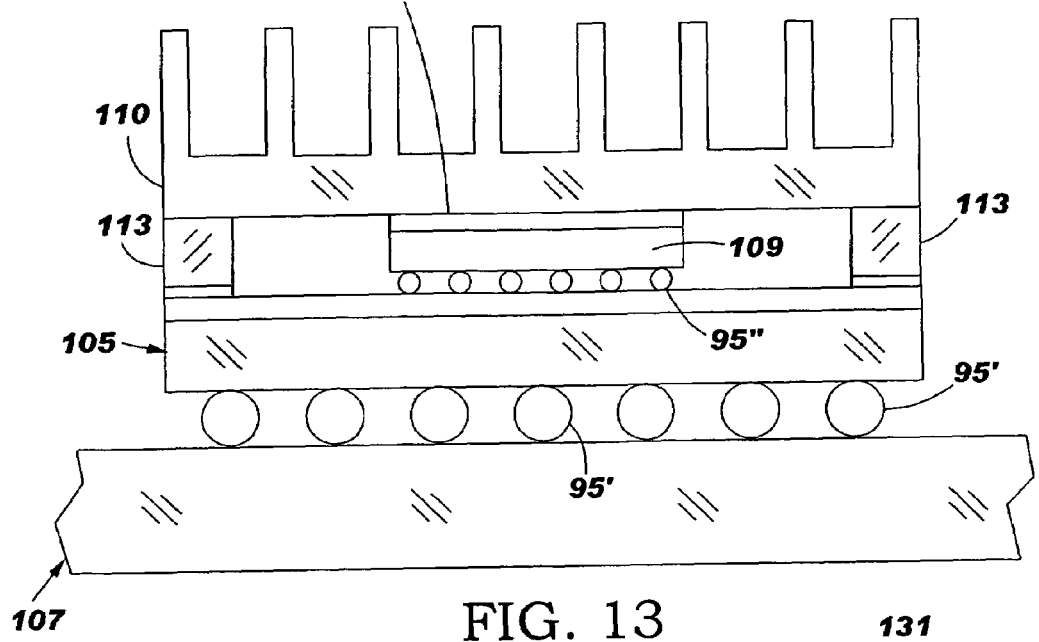
FIG. 12 is a side-elevational view illustrating an electronic assembly which may include circuitized substrates of the type defined herein as part thereof.

FIG. 12 represents examples of the structures defined hereinabove, the structure referenced by the numeral 105 being a chip carrier while the structure represented by the numeral 107 is a PCB. As stated, both structures are produced and sold by the assignee of the invention. In the embodiment (assembly) of FIG. 12, the chip carrier 105 is mounted on and electrically coupled to PCB 107 using a plurality of solder balls 95', the chip carrier 105 in turn having a semiconductor chip 109 positioned thereon and electrically coupled to the carrier using a second plurality of solder balls 95". The assembly in FIG. 12 may also include a heat sink 110 thermally coupled to chip 109 using a conductive paste 111 and positioned on the upper surface of carrier 105 by appropriate standoffs 113, as is known in the art.

Figure 13:
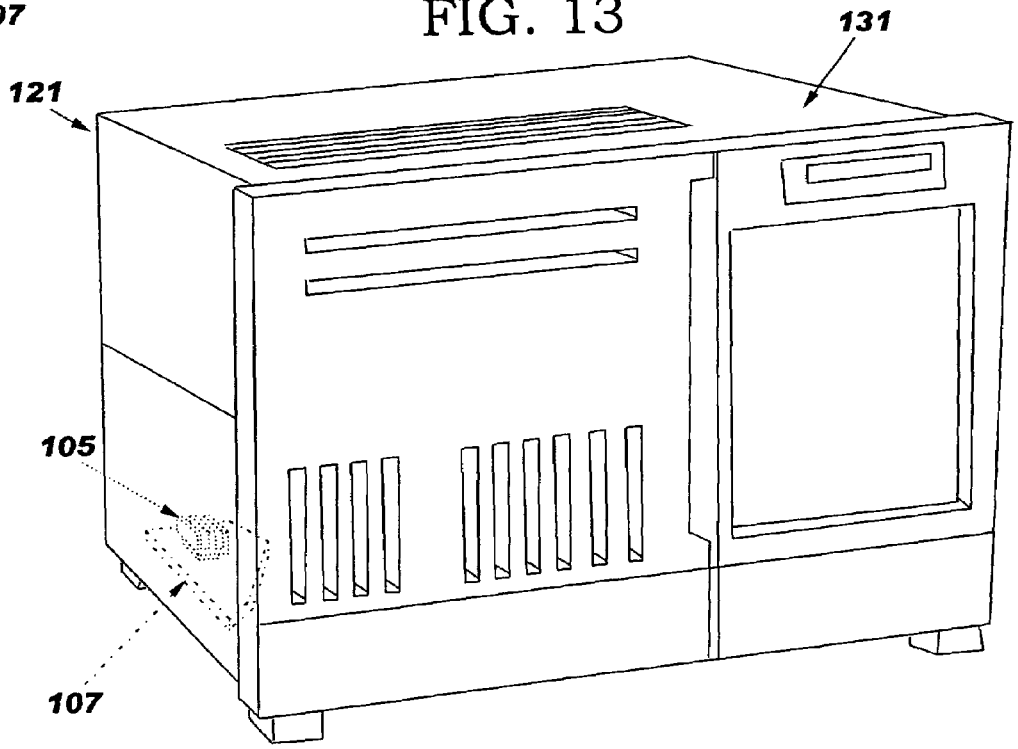
FIG. 13 is a perspective view of an information handling system adaptable for utilizing one or more electrical assemblies having one or more circuitized substrates as taught herein.

In FIG. 13, there is shown an information handling system 121 which is preferably a personal computer, a mainframe computer or a computer server. Other types of information handling systems known in the art of this type may also utilize the teachings of this invention. The circuitized substrate or substrates formed in accordance with the teachings herein may be utilized in the system 121 as a PCB 107 (shown hidden) and/or a chip carrier 105 (also shown hidden). The circuitized substrates may be utilized as a mother board in system 121 or as one or more individual PCBs typically utilized in such systems. The remaining elements of information handling systems of these types, such as the housing 131 which contains the PCB and chip carrier components, are known in the art. Such a housing 131, for example, is typically of a suitable electrically insulative material (e.g., plastic) for smaller systems such as personal computers but may be of aluminum or similar lightweight metal if for a larger system such as a mainframe or one of the larger servers known today. Further description of this and the other components of such a system is not believed necessary.

Thus there has been shown and described a circuitized substrate which utilizes at least one conductive plane therein formed in a new and unique manner so as to assure that the plane comprises at least two electrically isolated (separated) conductive portions which in turn may serve different electrical functions in the final product in which the substrate is utilized. An effective dielectric barrier is formed to assure effective separation of the two portions, while also assuring the substrate, in its simplest form, is of sufficient rigidity so as to be successfully used in conjunction with additional manufacturing processes (especially lamination) should the substrate be used as part of a larger product such as a multilayered PCB or the like. The various structures which may utilize one or more circuitized substrates taught herein thus also inherit the several advantageous features of this structure. The circuitized substrate as defined may be produced using known PCB manufacturing processes and thus at relatively low cost, thus presenting the possibility of lower costs for the assemblies utilizing these substrates.

While there have been shown and described what are at present the preferred embodiments of the invention, it will be obvious to those skilled in the art that various changes and modifications may be made therein without departing from the scope of the invention as defined by the appended claims.

What is claimed is:

1. A method of making a circuitized substrate, said method comprising:

providing at least one electrically conductive layer of substantially planar configuration and having first and second opposing surfaces, said at least one electrically conductive layer including at least two separate, electrically isolated portions, each electrically isolated portion including an edge portion substantially facing an edge portion of at least one other electrically isolated portion, each of said edge portions facing each other comprised of a plurality of contiguous formed open segments;

positioning a first dielectric layer on said first opposing surface of said at least one electrically conductive layer such that a portion of said first dielectric layer is also positioned within selected ones of said contiguous formed open segments of each of said facing edge portions;

providing a plurality of openings within said first dielectric layer which are each aligned above a respective one of the remaining ones of said contiguous formed open segments; and positioning a second dielectric layer on said second opposing surface of said at least one electrically conductive layer such that a portion of said second dielectric layer is positioned within said remaining ones of said contiguous formed open segments of each of said facing edge portions and within said plurality of openings within said first dielectric layer aligned above said respective ones of said remaining ones of said contiguous formed open segments, only said portion of said first dielectric layer being positioned within said selected ones of said contiguous formed open segments of each of said facing edge portions and substantially only said portion of said second dielectric layer being positioned with said remaining ones of said contiguous formed open segments of each of said facing edge portions and within said plurality of openings within said first dielectric layer aligned above said respective ones of said remaining ones of said contiguous formed open segments, said portions of both of said first and second dielectric layers positioned within said contiguous formed open segments of said facing edge portions providing a common, substantially solid dielectric barrier between said facing edge portions.

2. The method of claim 1 wherein said plurality of contiguous formed open segments are formed by drilling.

3. The method of claim 2 wherein said drilling is accomplished using mechanical drills.

4. The method of claim 2 wherein said drilling is accomplished using a laser.

5. The method of claim 1 wherein said positioning said first dielectric layer on said first opposing surface of said at least one electrically conductive layer and said substantially filling said selected ones of said contiguous formed open segments of said facing edge portions with a portion of said first dielectric layer are accomplished utilizing a lamination process.

6. The method of claim 5 wherein said positioning of said second dielectric layer on said second opposing surface of said at least one electrically conductive layer such that a portion of said second dielectric layer is positioned within said remaining ones of said contiguous formed open segments of each of said facing edge portions and within said plurality of openings within said first dielectric layer aligned above said respective ones of said remaining ones of said contiguous formed open segments are accomplished utilizing a lamination process.

7. The method of claim 1 wherein said at least one electrically conductive layer is provided of copper.

8. The method of claim 1 wherein said first dielectric layer is provided with a resin material as part thereof.

9. The method of claim 1 further including providing reinforcement material as part of said first dielectric layer.

10. The method of claim 9 wherein said reinforcement material is provided as fiberglass.

11. The method of claim 1 wherein said second dielectric layer is provided with a resin material as part thereof.

12. The method of claim 11 further including providing reinforcement material as part of said second dielectric layer.

13. The method of claim 12 wherein said reinforcement material provided as part of said second dielectric layer is provided as fiberglass.

* * * * *